(12) United States Patent
Wesselmann et al.

(10) Patent No.: US 7,186,629 B2
(45) Date of Patent: Mar. 6, 2007

(54) PROTECTING THIN SEMICONDUCTOR WAFERS DURING BACK-GRINDING IN HIGH-VOLUME PRODUCTION

(75) Inventors: Mark Wesselmann, Carlsbad, CA (US); Kostadin Petkov, San Diego, CA (US); Robert Metter, Portland, OR (US); Michael S. Wisnieski, Keizer, OR (US); John Boyd, Atascadero, CA (US)

(73) Assignee: Advanced Materials Sciences, Inc., Portland, OR (US)

( * ) Notice: Subject to any disclaimer, the term of this patent is extended or adjusted under 35 U.S.C. 154(b) by 0 days.

(21) Appl. No.: 10/716,992

(22) Filed: Nov. 19, 2003

(65) Prior Publication Data

US 2006/0008650 A1    Jan. 12, 2006

(51) Int. Cl.
  *H01L 21/46*    (2006.01)
(52) U.S. Cl. .................. 438/460; 438/459; 257/678; 257/687; 257/703; 257/794; 257/E23.127; 428/425.5
(58) Field of Classification Search ............... 438/758, 438/459, 460; 257/49, 678, 687, 794, 703; 428/425.5
See application file for complete search history.

(56) References Cited

U.S. PATENT DOCUMENTS

| | | | |
|---|---|---|---|
| 5,246,737 A | 9/1993 | Muradov | |
| 5,705,016 A | 1/1998 | Senoo et al. | |
| 6,911,358 B2 * | 6/2005 | Azami et al. | 438/150 |
| 6,946,236 B2 * | 9/2005 | Rottstegge et al. | 430/296 |
| 2005/0064681 A1 * | 3/2005 | Wood et al. | 438/459 |

OTHER PUBLICATIONS

PCT International Search Report dated Nov. 8, 2005, PCT/US04/36742.
PCT Written Opinion of ISA dated Nov. 8, 2005, PCT/US04/36742.

* cited by examiner

*Primary Examiner*—Alexander Ghyka
(74) *Attorney, Agent, or Firm*—Townsend and Townsend and Crew LLP

(57) ABSTRACT

A protective disk for protecting a semiconductor wafer during processing includes an adhesive layer configured to adhere to the semiconductor wafer and a support layer coupled to the adhesive layer configured to provide strength and stiffness to the semiconductor wafer during processing. In one aspect of the invention, the protective disk is soluble in a mildly alkaline or mildly acidic solution. In another aspect, the adhesive layer comprises a high molecular weight polymer. In another aspect, the support layer comprises a polymer and a filler. The present invention may enable a robust, cost-effective, high-volume, automated process for thinning semiconductor wafers below 150 μm, and for subsequent process steps of stress relief and transfer to a dicing frame for die singulation. Additionally, the invention enables use of existing toolsets and processes to produce thinner substrates than conventionally achievable.

28 Claims, 4 Drawing Sheets

PROTECTING THIN SEMICONDUCTOR WAFERS DURING BACK-GRINDING IN HIGH-VOLUME PRODUCTION

FIELD

The present invention relates to processing semiconductor wafers generally and in particular to processing thin semiconductor wafers.

BACKGROUND

Conventionally, there are two primary methods employed to back-grind very thin semiconductor wafers. A first method involves laminating a relatively thin, flexible tape to the device side of the wafer prior to back-grinding. In some cases, a layer of photoresist is applied to the device side of the wafer prior to the application of the tape. The wafer is then ground and stress is relieved by chemical etching or chemo-mechanical polishing. The tape is removed by peeling, and the photoresist (if used) is removed by immersion in a hot acid solution or solvent. The thinned wafer is then transferred to a dicing frame (a sheet of adhesive held taught by a square, rigid frame) for die singulation (dicing).

This first method may be adequate for processing where the final wafer thickness is greater than or equal to 300 µm. However, as the final thickness of the ground wafer is decreased, especially when the target reaches 150 µm or less, this method becomes problematic for several reasons. First, the combination of photoresist and tape does not provide sufficient mechanical strength/stiffness to adequately support the thinned wafer as it is removed from the grinder chuck and moved to subsequent processing stations. The insufficient thinned wafer support can result in increased propensity for the wafer to break apart. This problem grows more acute as the diameter of the wafer increases.

A second problem with this method is due to the fact that the combination of photoresist and tape is relatively soft and yielding. The depth of damage induced into the silicon wafer by the grinding process is a function of the stiffness and rigidity of the grinding system (grinding head, spindle, wheel, and chuck) and of the substrate (wafer) being ground: the greater the degree of stiffness of the substrate, the less the depth of grind damage, and vice-versa. Thus, the relatively soft and non-rigid character of the photoresist/tape combination induces a degree of chatter in the grind wheel which limits the final wafer thickness that can be achieved because the wafer can fall apart if the grind damage propagates all the way from the ground surface to the opposing surface of the wafer.

Further, in the case where no photoresist is used, problems can result from removal of the tape. Mechanical peeling of the tape can directly damage delicate device features. Further, stress induced in the overall wafer by the mechanical peeling can lead to warpage and/or curling of the wafer during subsequent processing and handling. The warpage and/or curling may result in wafer breakage or related problems.

In the case where a photoresist coating is used under the back-grinding tape, the removal of the photoresist poses a problem. Photoresist is typically removed with hot acid solutions or organic solvents. Acid solutions and organic solvents are both undesirable with respect to worker health and safety, environmental stewardship, and the costs and complications associated with waste management and removal.

The second primary method employed to back-grind wafers is conventionally used when the desired final wafer thickness falls below the threshold possible using the first method described above. This second method involves mounting the wafer to be thinned onto a rigid support structure (commonly made of stainless steel, ceramic, or quartz) through use of wax or other adhesive. This second method may be used to obtain final wafer thicknesses below 150 µm. However, this second method also has several problems.

First, the method requires that the thinned wafer be separated from its support plate prior to mounting the wafer on a dicing frame. The thinned wafer is therefore vulnerable to damage or breakage during the removal operation and subsequent transfer. The likelihood of this problem occurring increases as the thickness of the wafer decreases.

Second, the method is very difficult to automate. Rather, it is a labor-intensive process and highly dependent on the skills of the operator for its success. Consequently, the method offers a low throughput and a correspondingly high production cost. This method, therefore, is not suitable for cost-effective, automated high-volume production of mainstream commercial products.

SUMMARY

The invention overcomes the identified problems and provides improved protection of thin wafers during processing. In an exemplary embodiment, a protective disk for protecting a semiconductor wafer during processing includes an adhesive layer configured to adhere to the semiconductor wafer and a support layer coupled to the adhesive layer configured to support the semiconductor wafer during processing.

In one aspect of the invention, the protective disk is soluble in a mildly alkaline solution. In an alternate aspect, the protective disk is soluble in a mildly acidic solution. In another aspect, the adhesive layer comprises a high molecular weight polymer. In another aspect, the support layer comprises a polymer and a filler. In another aspect, the protective disk is substantially the same diameter as the semiconductor wafer. In another aspect, the thickness of the protective disk is approximately 600 µm. In another aspect, the adhesive layer has sufficient thickness to conform to topographical features of the semiconductor wafer. In another aspect, the protective disk provides support to the edge bevel of the semiconductor wafer. In another aspect, the protective disk also includes an intermediate layer located between the adhesive layer and the support layer configured to provide additional properties to the protective disk. In another aspect, the protective disk is sufficiently waterproof to endure a back-grinding process. In another aspect, the protective disk withstands chemistries used for post-grind stress removal. In another aspect, the coefficient of thermal expansion (CTE) of the protective disk corresponds to the CTE of the wafer being protected. In another aspect, the semiconductor wafer is thinned to less than 150 µm while attached to the protective disk.

The present invention may enable a robust, cost-effective, high-volume, automated process for thinning semiconductor wafers below 150 µm, and for subsequent process steps of stress relief and transfer to a dicing frame for die singulation. Thus, the present invention may enable widespread commercialization of semiconductor devices requiring very thin final wafer thickness. Transfer of the wafer onto the dicing frame can be performed while the protective disk is left intact on the device side of the wafer, thereby providing additional strength to the wafer during transfer. The protective disk may then be removed from the wafer after safe transfer to the dicing frame. Further, the invention enables use of existing toolsets and processes to produce thinner substrates than conventionally achievable (due to breakage during post-grind handling). Additionally, the invention enables thin wafer processing to be carried out in an automated manner. Thus, wafer processing using the invention may result in higher yields and lower operating cost than previously available. The throughput of the process may exceed what is achievable with conventional back-grind process sequences for wafers having a final wafer thickness greater than or equal to 300 μm.

DETAILED DESCRIPTION

Figure 1:
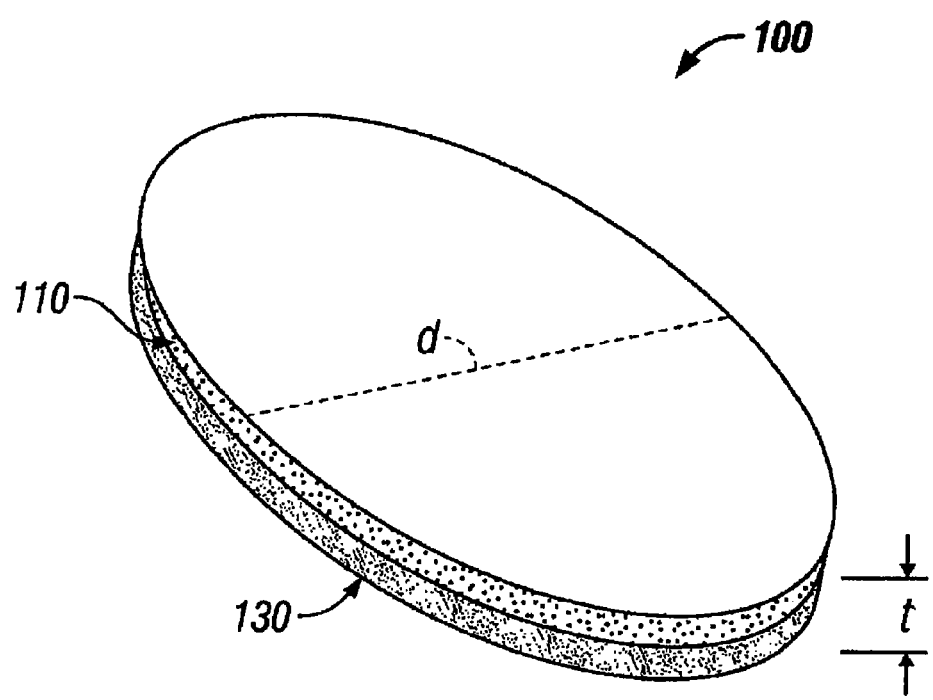
FIG. 1 is a perspective view showing a protective disk for protecting a semiconductor wafer during processing, according to one embodiment of the present invention.

FIG. 1 is a perspective view showing a protective disk 100 for protecting a semiconductor wafer during processing, according to one embodiment of the present invention. In the embodiment depicted in FIG. 1, the protective disk 100 includes an adhesive layer 130 configured to adhere to the semiconductor wafer (wafer) and a support layer 110 coupled to the adhesive layer configured to support the semiconductor wafer during processing. That is, for example, the support layer 110 may provide strength and stiffness to the semiconductor wafer during processing. The embodiment depicted in FIG. 1 represents the simplest embodiment of a protective disk, involving only two layers: the adhesive layer 130 and the support layer 110. Additional embodiments using any number of layers within the protective disk are also possible and will be discussed further below with reference to FIGS. 3 and 4.

In one embodiment, referring again to FIG. 1, composition of the adhesive layer 130 includes a polymer, such as for example, a high molecular weight polymer. The polymer, in one aspect, is soluble in a cleaning solution, such as for example, a mildly alkaline or a mildly acidic solution. The polymer may be relatively tough. The polymer also may include functional groups on the polymer backbone. In another aspect, a liquid form of the polymer is cast into a sheet of thickness ranging from 10 microns to 2100 microns. The polymer may be cast using any casting method, such as for example, tape casting. The polymer may be cast with sufficient width to accommodate the diameter of the semiconductor wafer to be processed.

In one embodiment, the support layer 110, is composed of a polymer-binder system in which a polymer is combined with a filler. The polymer used in the support layer 110 may be the same as the polymer used in the adhesive layer 130. In one aspect, the filler includes one or more of the following: alkali oxides, alkali salts, transition metal oxides, transition metal salts, alkaline earth oxides, alkaline earth salts and/or any other type of fiber or filler used in filled polymeric systems that combine synergistically with the polymer to provide desired mechanical properties to the support layer 110. Two examples of fillers that may be used are finely powdered magnesium carbonate and finely powdered alumina. Other fillers are also contemplated. The percentage by weight of the filler in the support layer 110 may range from 1% to 95%. By increasing the amount of filler, the stiffness (bulk modulus) of the resulting support layer 110 increases, at the expense of increased brittleness and reduced water-resistance. The amount of filler to be used, and the resulting toughness/brittleness of the support layer 110, may depend on factors unique to each application, such as the final post-backgrind thickness target, semiconductor wafer diameter, and handling methods that are employed.

In another embodiment, the support layer 110 includes one or more reinforcements, such as for example: fibers, mattings, platelets, and/or whiskers. The reinforcement(s) may be composed of any suitable material, such as for example: glasses, carbons, ceramics, and/or polymers.

In one aspect, the adhesive layer 130 and the support layer 110 are joined together by lamination to produce a laminate sheet. The protective disk 100 may be formed having appropriate shape and diameter from the laminate sheet by, for example, die stamping.

In one aspect, the diameter of the protective disk 100 corresponds to the diameter of the semiconductor wafer. For example, in FIG. 1, the diameter of the protective disk 100 (indicated as "d") is substantially the same as the diameter of the semiconductor wafer to which it is to be affixed. In another aspect, the thickness of the protective disk 100 (indicated as "t" in FIG. 1) is approximately 600 μm.

The protective disk 100 may possess any of several other properties. In order to adequately support a very thin and fragile semiconductor wafer, the bulk modulus of the protective disk 100 may be sufficient to provide strength and stiffness to composite of the protective disk and the semiconductor wafer (wafer/disk composite) while providing sufficient suppleness and toughness to prevent brittle failure of the wafer/disk composite during processing and handling. The wafer/disk composite is described further below with reference to FIG. 2. Referring again to FIG. 1, the protective disk 100 may also be sufficiently waterproof to endure a back-grinding process without significant damage. Further, the protective disk 100 may withstand chemistries used for post-grind stress (such as, for example, strong acids). Additionally, the coefficient of thermal expansion (CTE) of the protective disk may be tailored (through the formulation of the polymer/binder system and also through the lamination schedule of the various protective disk layers employed) to correspond to the wafer being processed. By making the CTE of the protective disk correspond to the CTE of the wafer being processed, stress imparted to the device structures can be minimized should the wafer be subjected to a range of temperatures as it is processed after attachment of the protective disk to the wafer. The protective disk 100 may also be removable by contact with either a mildly alkaline solution or, alternatively, a mildly acidic solution, with minimal mechanical intervention. Whether the protective disk 100 is soluble in an acidic or alkaline solution can be determined by manipulating the functional groups on the polymer backbone of the protective disk. For example, a mildly alkaline solution such as a hydroxide of ammonium and/or a hydroxide of potassium may be used to remove the protective disk 100.

In one embodiment, when the protective disk 100 is applied to a surface of the semiconductor wafer, such as the surface upon which the semiconductor devices are fabricated (device side), the protective disk 100 imparts sufficient structural strength and rigidity to the semiconductor wafer such that, following the reduction of the thickness of the semiconductor wafer (thinning) by back-grinding or other processing, the semiconductor wafer can be processed and handled without risk of breakage using conventional processing and handling tools and methods. Additionally, the protective disk may conform to any topography or surface features present on the surface of the semiconductor wafer (such as solder bumps in the case of wafers intended for flip-chip packaging). Furthermore, the protective disk 100 may protect semiconductor devices from damage due to abrasion from the back-grinding chuck, chemical attack from chemical agents used in post-backgrind stress relief, handling equipment used to transport the wafer, or other processes subsequent to back-grinding. After the protective disk 100 is no longer required, such as after the semiconductor wafer has been mounted on a dicing frame, before die singulation (dicing), the protective disk 100 may be removed from the semiconductor wafer through contact with a mild aqueous cleaning solution, such as a weakly alkaline or weakly acidic cleaning solution. The mild aqueous cleaning solution may be environmentally friendly.

In one embodiment, the present invention may be used in processing where the final thickness of the semiconductor wafer is 150 μm or less. Such processing may be executed in an automated, high-volume production environment. Areas of application of for the present invention include stacked-die, system-in-package (SiP), and other advanced packaging technologies in which ultra-thin die are required to provide maximum functionality in the smallest possible space, such as for smart cards, flash memory, and mobile communication devices.

FIG. 2A–2D are cross-sectional views of a wafer/disk composite 200, according to one embodiment of the invention. In the embodiment depicted in FIG. 2A, the wafer/disk composite 200 includes the protective disk 100, which is affixed to the device side of a semiconductor wafer 210. The device side of the semiconductor wafer 210 includes topographical features such as solder bumps 225. The adhesive layer 130 of the protective disk 100 has sufficient thickness to conform to the topographical features of the semiconductor wafer 210. Furthermore, the protective disk 100 provides full support of the edge bevel of the semiconductor wafer 210 (indicated by "e" in FIG. 2A–2C).

Figure 2A:
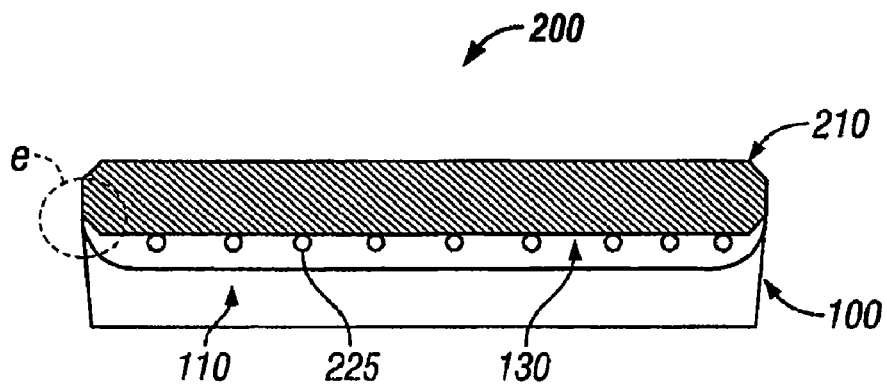
FIG. 2A–2D are cross-sectional views of a wafer/disk composite, according to one embodiment of the invention.
Figure 2B:
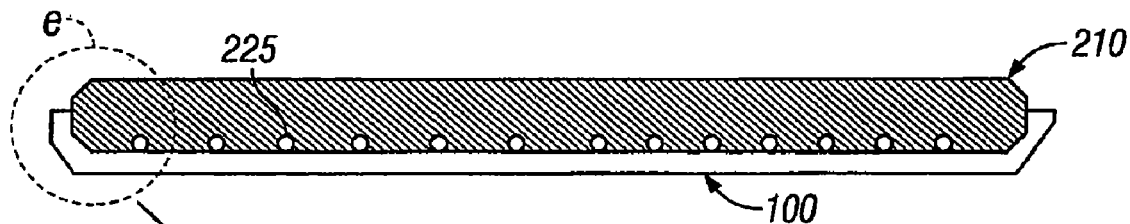
Figure 2C:
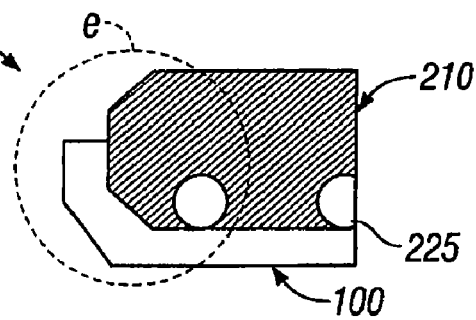
Figure 2D:
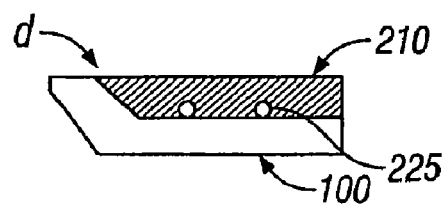

The support of the edge bevel of the semiconductor wafer 210 during grinding is further illustrated in FIGS. 2B–2D. FIG. 2B shows the wafer/composite 200 with support of the edge bevel at e, before the semiconductor wafer 210 is ground. FIG. 2C is a close-up view of the edge bevel support at e, before the semiconductor wafer 210 is ground. FIG. 2D shows an example of how the semiconductor wafer 210 looks after grinding. The edge bevel of the semiconductor wafer has been supported and a new edge of the semiconductor wafer 210 (indicated by "b" in FIG. 2D) is defined.

Figure 3:
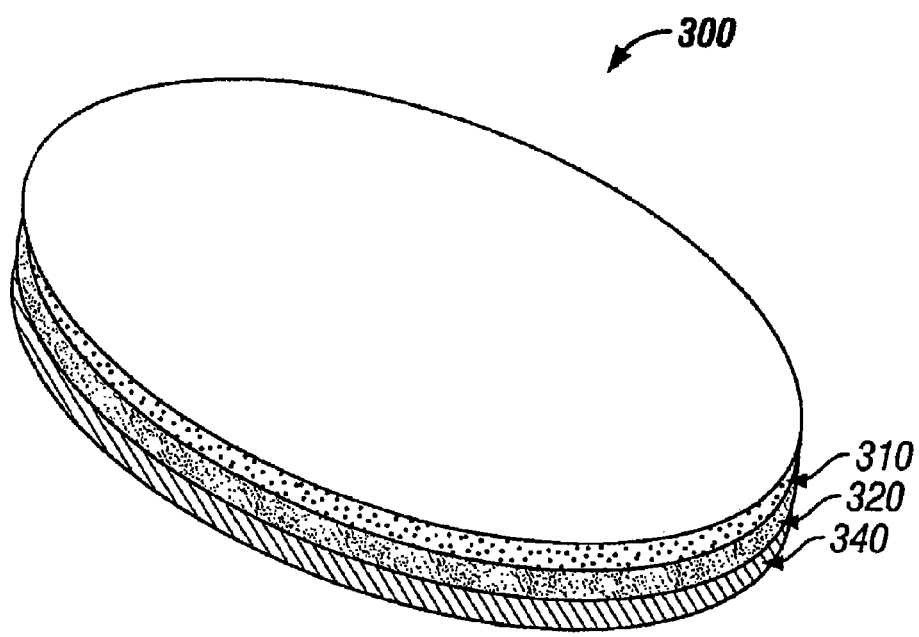
FIG. 3 is a perspective view showing a protective disk for protecting a semiconductor wafer during processing, according to another embodiment of the present invention.

FIG. 3 is a perspective view showing a protective disk 300 for protecting a semiconductor wafer during processing, according to another embodiment of the present invention. In the embodiment depicted in FIG. 3, the protective disk 300 includes an adhesive layer 340, an intermediate layer 320, and outer layer 310. The intermediate layer 320 may provide enhanced strength to the protective disk 300. For example, the strength of the protective disk 300 may be enhanced in the x, y and/or z directions by the intermediate layer 320. The intermediate layer 320 also may provide ability to conform to topographical features of the semiconductor wafer. The use of three layers in the embodiment depicted in FIG. 3 is exemplary only. Any number of layers may be used to tailor the properties of the protective disk 300 to suit the requirements of any particular application. For example, layers of the protective disk 300 may be tailored to have a particular coefficient of thermal expansion (CTE), moisture resistance and/or toughness.

Figure 4:
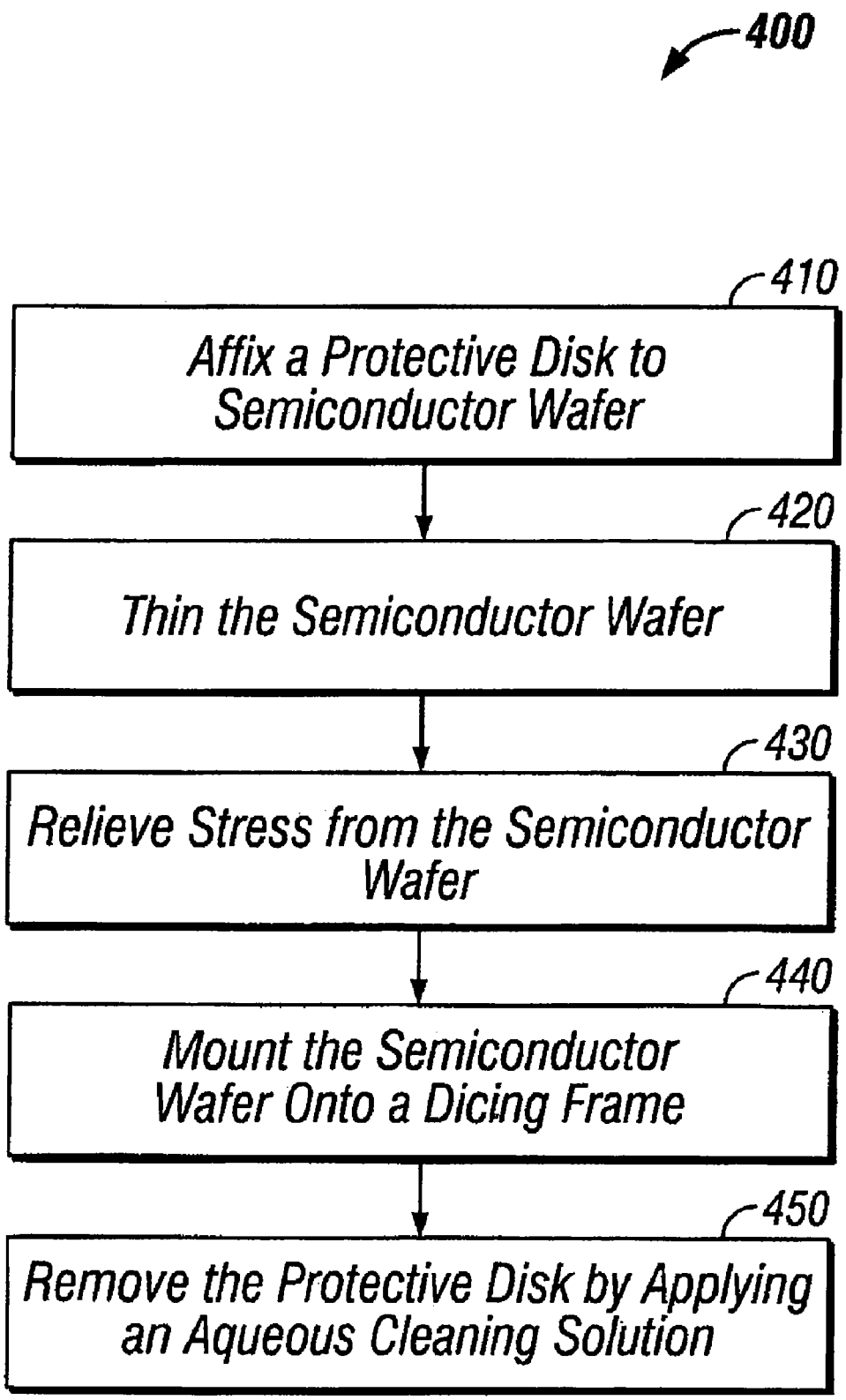
FIG. 4 is a flow diagram of one embodiment of a method for protecting a semiconductor wafer during processing.

FIG. 4 is a flow diagram of one embodiment of a method for protecting a semiconductor wafer during processing. At step 410, a protective disk is affixed to device side of a semiconductor wafer. At step 420, the semiconductor wafer is thinned with the protective disk affixed. At step 430, stress is relieved from the semiconductor wafer. In one aspect of the invention, the stress relieving step 430 is optional. At step 440, the semiconductor is mounted onto a dicing frame with the protective disk affixed. At step 450, the protective disk is removed by applying an aqueous cleaning solution. The method described with reference to FIG. 4 may also include conforming edge of the protective disk to edge profile of the semiconductor wafer. Conforming the edge of the protective disk to the edge profile of the semiconductor wafer may ensure that the typically delicate wafer edge is supported during back-grinding and subsequent processing. Whether or not the conforming step is implemented may depend upon the thickness and hardness of the respective protective disk.

The affixing step 410 may further include displacing trapped air from between the protective disk and the semiconductor wafer. The affixing step may be augmented by application of heat and/or pressure and/or vacuum.

In one aspect, the protective disk may be affixed to the device side of the semiconductor wafer by lamination. The semiconductor wafers may be fed, one at a time, from a standard wafer cassette and transported into close proximity to the protective disks, which are dispensed from a suitable holder or "magazine". The wafer and disk may then be brought together in a manner that displaces trapped air between the mating surfaces, optionally augmented by the application of heat and/or pressure. Once the protective disk has been applied, conforming the edge of the protective disk to the edge profile of the wafer may be undertaken. In one aspect, the protective disk is affixed to the semiconductor wafer in solid form. In another aspect, the protective disk is affixed to the semiconductor wafer in liquid form. Where the protective disk is affixed in liquid form, the affixing step 410 may include one or more of the following application methods: screen printing, doctor blading, waterfall, and/or spin coating.

In yet another aspect, the affixing step 410 includes using a tape roll system to apply chemicals that constitute the protective disk (constituent chemicals), such as a polymer and a filler, to the semiconductor wafer. A partial drying or curing of the polymer may be performed to facilitate attachment of the constituent chemicals to the semiconductor wafer via a roll of flexible tape. Following application of the constituent chemicals to the wafer, the constituent chemicals are dried or cured to achieve desired characteristics. Furthermore, depending on the fillers used, an additional heat and/or cure cycle can be used as a "tuning knob" for final target properties by increasing potential binder-filler interactions.

In one aspect, the thinning step 420 thins the semiconductor wafer to a thickness below 150 μm. In another aspect, the stress relieving step 430 relieves stress from the semiconductor wafer by, for example, chemical etching and/or chemo-mechanical polishing.

The aqueous cleaning solution used in the removing step 450 may be, for example, an alkaline solution or an acidic solution. Examples of cleaning solutions include, but are not limited to, hydroxides of ammonium (NH₄OH), hydroxides of sodium (NaOH), and hydroxides of potassium (KOH). It may, for example, be desirable to use a protective disk having a composition that is soluble in acidic solution where alkaline chemistries are employed during post-grind stress relief. The removing step 450 may include applying energy to remove the protective disk. The energy applied to remove the protective disk may be, for example, mechanical agitation and/or sound waves such as ultrasonic or megasonic waves. The energy applied should be sufficiently gentle so as not to cause damage to the semiconductor devices. The removal step 450 may also be augmented by impingement of medium-pressure steam and optionally augmented with alkaline or acidic liquid entrainment. The method described with reference to FIG. 4 may also include processing waste materials that are produced by the removing step 450. The processing of waste materials may include collection of the waste materials, separation of solid from liquid waste, and compaction.

The present invention may enable a robust, cost-effective, high-volume, automated process for thinning semiconductor wafers below 150 μm, and for subsequent process steps of stress relief and transfer to a dicing frame for die singulation. Thus, the present invention may enable widespread commercialization of semiconductor devices requiring very thin final wafer thickness. Transfer of the wafer onto the dicing frame can be performed while the protective disk is left intact on the device side of the wafer, thereby providing additional strength to the wafer during transfer. The protective disk may then be removed from the wafer after safe transfer to the dicing frame. Further, the invention enables use of existing toolsets and processes to produce thinner substrates than conventionally achievable (due to breakage during post-grind handling). Additionally, the invention enables thin wafer processing to be carried out in an automated manner. Thus, wafer processing using the invention may result in higher yields and lower operating cost than previously available. The throughput of the process may exceed what is achievable with conventional back-grind process sequences for wafers having a final wafer thickness greater than or equal to 300 μm.

Having disclosed exemplary embodiments and the best mode, modifications and variations may be made to the disclosed embodiments while remaining within the subject and spirit of the invention as defined by the following claims.

The invention claimed is:

1. A protective disk for protecting a semiconductor wafer during processing, comprising:
   an adhesive layer including a first surface region configured to adhere to the semiconductor wafer, the adhesive layer including a second surface region opposite to the first surface region, the adhesive layer comprising a high molecular weight polymer, wherein the polymer is soluble in one of the group consisting of: a mildly alkaline solution and a mildly acidic solution; and
   a support layer coupled to the second surface region of the adhesive layer, the support layer being configured to support the adhesive layer and the entire semiconductor wafer during processing.

2. The protective disk of claim 1, wherein the support layer comprises a polymer and at least one of the group consisting of:
   a filler; and
   a reinforcement.

3. The protective disk of claim 2, wherein the filler comprises one or more of the group consisting of:
   alkali oxides;
   alkali salts;
   transition metal oxides;
   transition metal salts;
   alkaline earth oxides; and
   alkaline earth salts.

4. The protective disk of claim 3, wherein the percentage by weight of filler in the support layer ranges from 1% to 95%.

5. The protective disk of claim 2, wherein the reinforcement is at least one of the group consisting of:
   a fiber;
   a matting;
   a platelet; and
   a whisker;
   and, wherein the reinforcement comprises at least one of the group of materials consisting of:
   a glass;
   a ceramic;
   a carbon; and
   a polymer.

6. The protective disk of claim 1, wherein the protective disk is substantially the same diameter as the semiconductor wafer.

7. The protective disk of claim 1, wherein thickness of the protective disk is approximately 600 μm.

8. The protective disk of claim 1, wherein the adhesive layer has sufficient thickness to conform to topographical features of the semiconductor wafer.

9. The protective disk of claim 1, wherein the protective disk provides support to edge bevel of the semiconductor wafer.

10. The protective disk of claim 1, further comprising:
    an intermediate layer located between the adhesive layer and the support layer configured to provide additional properties to the protective disk.

11. The protective disk of claim 10, wherein the intermediate layer is configured to provide at least one of the group consisting of:
    ability to conform to topographical features of the semiconductor wafer; and
    enhanced strength of the protective disk.

12. The protective disk of claim 1, wherein bulk modulus of the protective disk is sufficient to provide strength and stiffness to wafer/disk composite and to provide sufficient suppleness and toughness to prevent brittle failure of the wafer/disk composite.

13. The protective disk of claim 1, wherein the protective disk is sufficiently waterproof to endure a back-grinding process.

14. The protective disk of claim 1, wherein the protective disk withstands chemistries used for post-grind stress relief.

15. The protective disk of claim 1, wherein the coefficient of thermal expansion (CTE) of the protective disk is tailored to correspond to the CTE of the semiconductor wafer.

16. The protective disk of claim 1, wherein the protective disk is removable by contact with one of the group consisting of:
    a mildly alkaline solution; and
    a mildly acidic solution.

17. The protective disk of claim 16, wherein the mildly alkaline solution is selected from the group consisting of:
    hydroxides of ammonium; and
    hydroxides of potassium.

18. The protective disk of claim 1 wherein the polymer includes a functional group selected to impart solubility to the polymer in the mildly alkaline solution or the mildly acidic solution.

19. A disposable disk for protecting a semiconductor wafer during a process, the disposable disk comprising:
- a substantially circular plate configured for supporting an entire surface of the semiconductor wafer, the circular plate being characterized by a plate diameter substantially the same as the wafer diameter of the semiconductor wafer, the circular plate comprising a polymer material removable by contact with a cleaning solution; and
- an adhesive layer coupled to the circular plate, the adhesive layer having sufficient width to accommodate the diameter of the semiconductor wafer for attaching the circular plate to an entire surface of the semiconductor wafer, the adhesive layer being removable by contact with the cleaning solution.

20. The disposable disk as recited in claim 19, wherein the cleaning solution is a mildly alkaline solution.

21. The disposable disk as recited in claim 19, wherein the cleaning solution is a mildly acidic solution.

22. The disposable disk as recited in claim 19, wherein the circular plate and the adhesive layer include polymer functional groups that can withstand strong acids for post-grind stress relief and are removable by contact with a mildly alkaline solution.

23. The disposable disk as recited in claim 19, wherein the disposable disk is made from a process comprising:
- joining an adhesive layer and a support layer by lamination; and
- forming the disposable disk by die stamping.

24. The protective disk of claim 19, wherein the adhesive layer has sufficient thickness to conform to topographical features of the device side of the semiconductor wafer.

25. The disposable disk as recited in claim 19, wherein the cleaning solution is a hydroxide of ammonium.

26. The disposable disk as recited in claim 19, wherein the cleaning solution is a hydroxide of potassium.

27. A disposable disk for protecting a substrate during a grinding process, the disposable disk comprising:
- a substantially circular plate comprising a continuous member extending the entirety of a surface of the substrate, the circular plate being characterized by a plate diameter substantially the same as a substrate diameter of the substrate, the circular plate being removable by contact with a cleaning solution; and
- an adhesive layer coupled to the circular plate, the adhesive layer having sufficient width to accommodate the diameter of the substrate for attaching the circular plate to an entire surface of the substrate, the adhesive layer being removable by contact with the cleaning solution.

28. The disposable disk as recited in claim 27, wherein the disposable disk provides support to edge bevel of the substrate.

* * * * *